United States Patent [19]

Perduijn et al.

[11] 4,383,196
[45] May 10, 1983

[54] PIEZOELECTRIC CERAMIC BODY FOR AN ELECTROMECHANICAL TRANSDUCER

[75] Inventors: David J. Perduijn; Jacobus Verberkt, both of Eindhoven, Netherlands

[73] Assignee: U.S. Philips Corporation, New York, N.Y.

[21] Appl. No.: 389,201

[22] Filed: Jun. 17, 1982

Related U.S. Application Data

[63] Continuation-in-part of Ser. No. 149,784, May 14, 1980.

[30] Foreign Application Priority Data

May 21, 1979 [NL] Netherlands ..................... 7903964

[51] Int. Cl.³ ............................................. H01L 41/08
[52] U.S. Cl. ..................... 310/358; 252/62.9
[58] Field of Search ................... 310/311, 358, 359, 357; 252/62.9

[56] References Cited

U.S. PATENT DOCUMENTS

| | | | |
|---|---|---|---|
| 2,708,244 | 5/1955 | Jaffe | 310/358 |
| 3,021,441 | 2/1962 | Howatt | 310/358 |
| 3,404,296 | 10/1968 | Jaffe | 310/358 X |
| 4,333,842 | 6/1982 | Ito et al. | 310/358 X |

Primary Examiner—Mark O. Budd
Attorney, Agent, or Firm—Norman N. Spain

[57] ABSTRACT

Electromechanical transducer comprising a piezoelectric body consisting of $Pb_{1-a}M_a(Mg_{(1-b)/3}Mn_{b/3}Sb_{2/3})_xTi_yZr_zO_3$, wherein M is one or more of the alkaline earth metals Ca, Sr and Ba, and wherein
$0 \leq a \leq 0.15$,
$0 \leq b \leq 0.20$,
$0.01 \leq x \leq 0.25$,
$0.40 \leq y \leq 0.55$,
$0.20 \leq z \leq 0.59$ and
$(x+y+z)=1$.

This material has the advantage that polarization is effected in a very short period of time at room temperature.

2 Claims, 5 Drawing Figures

PIEZOELECTRIC CERAMIC BODY FOR AN ELECTROMECHANICAL TRANSDUCER

This application is a continuation-in-part of Application Ser. No. 149,784, filed May 14, 1980.

BACKGROUND OF THE INVENTION

The invention relates to a piezoelectric body for an electromechanical transducer comprising a ceramic piezoelectric material and to such a transducer.

This type of ceramic material is based on the system $PbTiO_3$-$PbZrO_3$, which system is known from U.S. Pat. No. 2,708,244. A number of improvements have been developed from this basic system, depending on the intended use of the material, making certain additives to the lead titanate zirconate.

An improved material is inter alia described in U.S. Pat. No. 3,268,453, this material having a composition within the ternary system $PbTiO_3$-$PbZrO_3$-$Pb(Mg_{\frac{1}{3}}Nb_{\frac{2}{3}})O_3$ of the perowskite system. Distinctive features of this material are a relatively high dielectric constant and a high piezoelectric response.

Such a ceramic body, obtained by sintering a starting mixture must be polarized to make it suitable for use as a piezoelectric transducer, that is to say the elementary electric dipoles must be irreversibly oriented in an electric field.

Most known materials of this type have the drawback that polarization must be effected at an elevated temperature, namely at a temperature between 100° and 200° C., and/or for a long period of time (~1 hour), and an electrically non-conductive oil at a field strength of 1.5–4 MV/m.

SUMMARY OF THE INVENTION

The piezoelectric body for an electromechanical transducer on the basis of the ternary system lead titanate—lead zirconate and a lead compound of this type, wherein part of the total Ti and Zr has been replaced in a ratio of $\frac{1}{3}$ mole of a bivalent metal land by $\frac{2}{3}$ mole of a pentavalent metal, is characterized according to the invention in that it consists of $Pb_{1-a}M_a(Mg_{(1-b)/3}Mn_{b/3}Sb_{\frac{2}{3}})_xTi_yZr_zO_3$, wherein M is one or more of the alkaline earth metals Ca, Sr and Na, $0 \leq a \leq 0.15$,
$0 \leq b \leq 0.20$,
$0.01 \leq x \leq 0.25$,
$0.40 \leq y \leq 0.55$,
$0.20 \leq z \leq 0.59$ and $(x+y+z)=1$.

According to the invention there is provided a piezoelectric material having a composition within a range wherein a formed body consisting of this material can as a rule be polarized in a very short period of time (between 1 sec. and 5 min.) at room temperature so as to produce polarized bodies having good piezoelectric properties. In addition, the material according to the invention has the advantage that the piezoelectric properties have a satisfactory stability as a function of the temperature and the time, in spite of the short polarization time. The piezoelectric response changes only slightly up to 100° C. and has a good stability with time.

The feature that polarization can be effected at room temperature has the important advantage that the piezoelectric body can be built into an assembly and that this assembly may then be subjected to the polarization treatment.

Such an assembly may be made, for example, by securing the piezoelectric body to a membrane with an adhesive which is cured at an elevated temperature (>150° C.), or by soldering the piezoelectric body to a substrate. The fact that polarization is not effected until after the assembly is room temperature prevents the piezoelectric properties of the body from degenerating by reason of the polarized body being heated to the high temperature at which the body is attached.

According to an elaboration of the invention, a further improvement of the properties is accomplished by replacing up to a total of 15 mol. % of Pb equimolarly by one or more of the alkaline earth metals Ca, Sr and Ba.

A reduction in the loss factor (tan δ) is accomplished by replacing up to 20 mol. % of the Mg by Mn. This is advantageous for some applications.

A further range of compositions is found between the boundaries:
$x = 0.125$–$0.15$
$y = 0.44$–$0.46$ and
$z = 0.38$–$0.44$,
in a composition of the general formula $$Pb_{1-a}Sr_a[(Mg_{1-b}Mn_b)_{\frac{1}{3}}Sb_{\frac{2}{3}}]_xTi_yZr_zO_3$$

in which a (=the molar fraction of Sr) is 0.05 and b is the molar fraction of Mn. These compositions can be polarized at room temperature within 1 sec. They are suitable for low power uses, having a high sensitivity and a high piezoelectric response, and are therefor particularly suitable for use in buzzers, smoke detectors and high-frequency loudspeakers.

DESCRIPTION OF THE PREFERRED EMBODIMENTS

The invention will now be further illustrated with reference to a number of embodiments.

The starting materials, namely lead oxide (PbO), magnesium oxide (MgO), antimony pentoxide ($Sb_2O_5$), titanium dioxide ($TiO_2$) and zirconium dioxide ($ZrO_2$), and, if necessary, SrO, BaO, CaO and/or $MnO_2$, all these materials being of a chemically pure quality, are mixed with distilled water in a rubber-lined ball mill.

After wet-milling, the mixture is dried. Thereafter, the mixture is subjected to a first reaction by heating the mixture for 2 hours at a temperature of approximately 850° C. in an oxygen atmosphere.

The material is thereafter allowed to cool, after which it is milled again. The powder thus obtained is then compressed to form cylinders having a diameter of 15 mm and a height of 20 mm by use of a pressure of 70 MPa. The cylinders are sintered for 45 minutes at 1150°–1300° C., depending on the composition, in an oxygen atmosphere, in a closed container formed from a refractory material, to prevent evaporation of lead. After cooling, the cylinders are reduced to 12 mm by grinding and the ground cylinders are cut into 1 mm thick discs.

After having been provided with electrodes, the discs are polarized in air or in silicone oil for 1 sec. to 5 minutes at a temperature between 20° and 200° C., depending on the composition, in a field of 1-3 MV/m.

The following Table I shows a number of compositions within the range according to the invention with a number of physical properties, namely the density $\rho_s$, the dielectric constant $\Sigma_{33}^T/\Sigma_0$, the dielectric loss factor tan $\delta$, the planar coupling coefficient $k_p$, the frequency constant $N_p$ and the charge constant $d_{31}$.

Table II illustrates the time stability and the temperature stability, measured 24 hours after composition 18 of Table I had been subjected to a temperature treatment at 100° C. for 1 hour.

Figure 1:
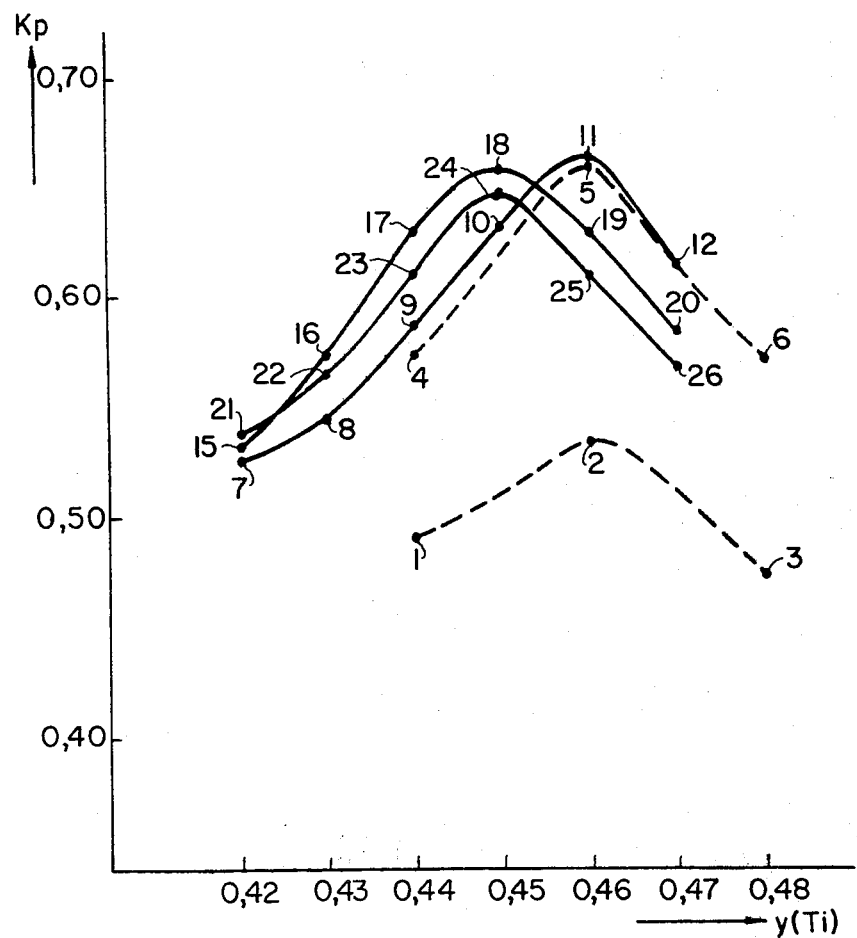
FIG. 1 is a graph showing the relationship of the planar coupling coefficient Kp to the Ti content.
Figure 2:
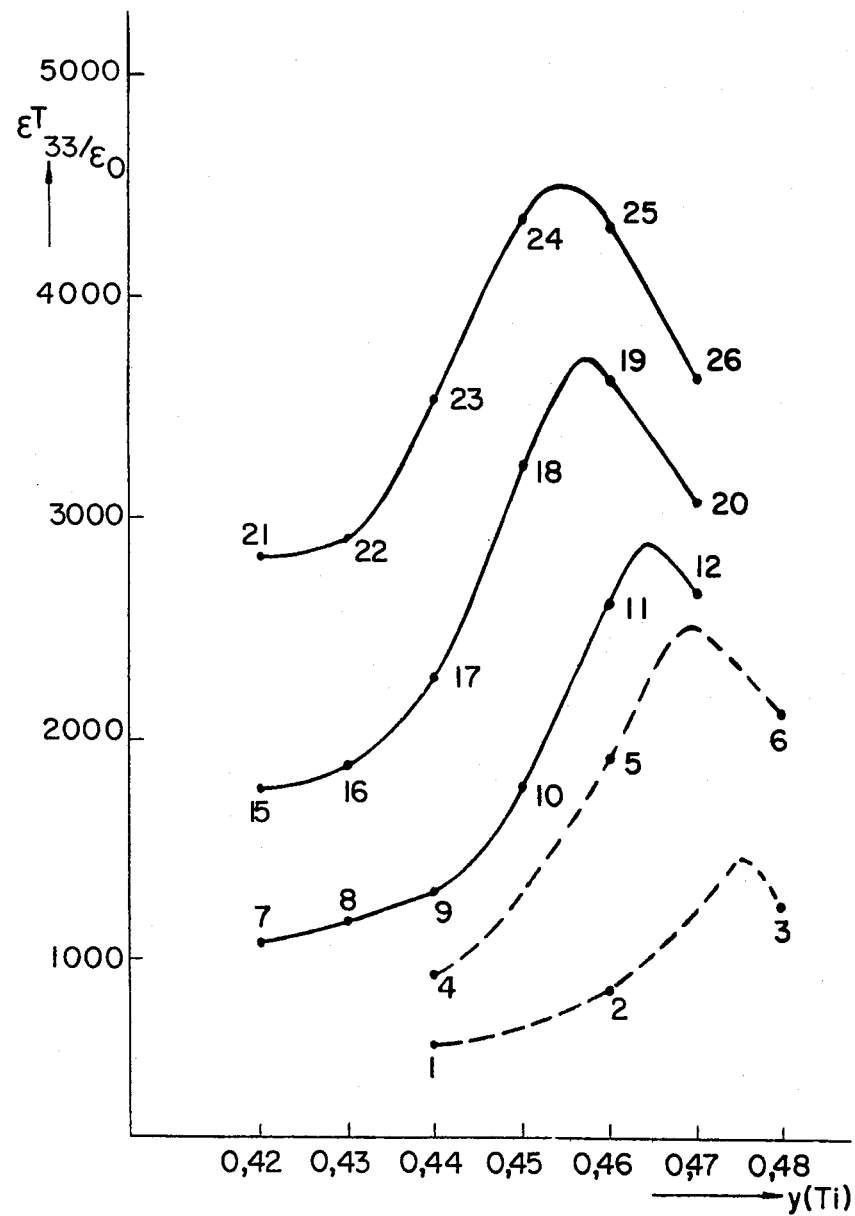
FIG. 2 is a graph showing the dielectric constant as a function of the Ti content.
Figure 3:
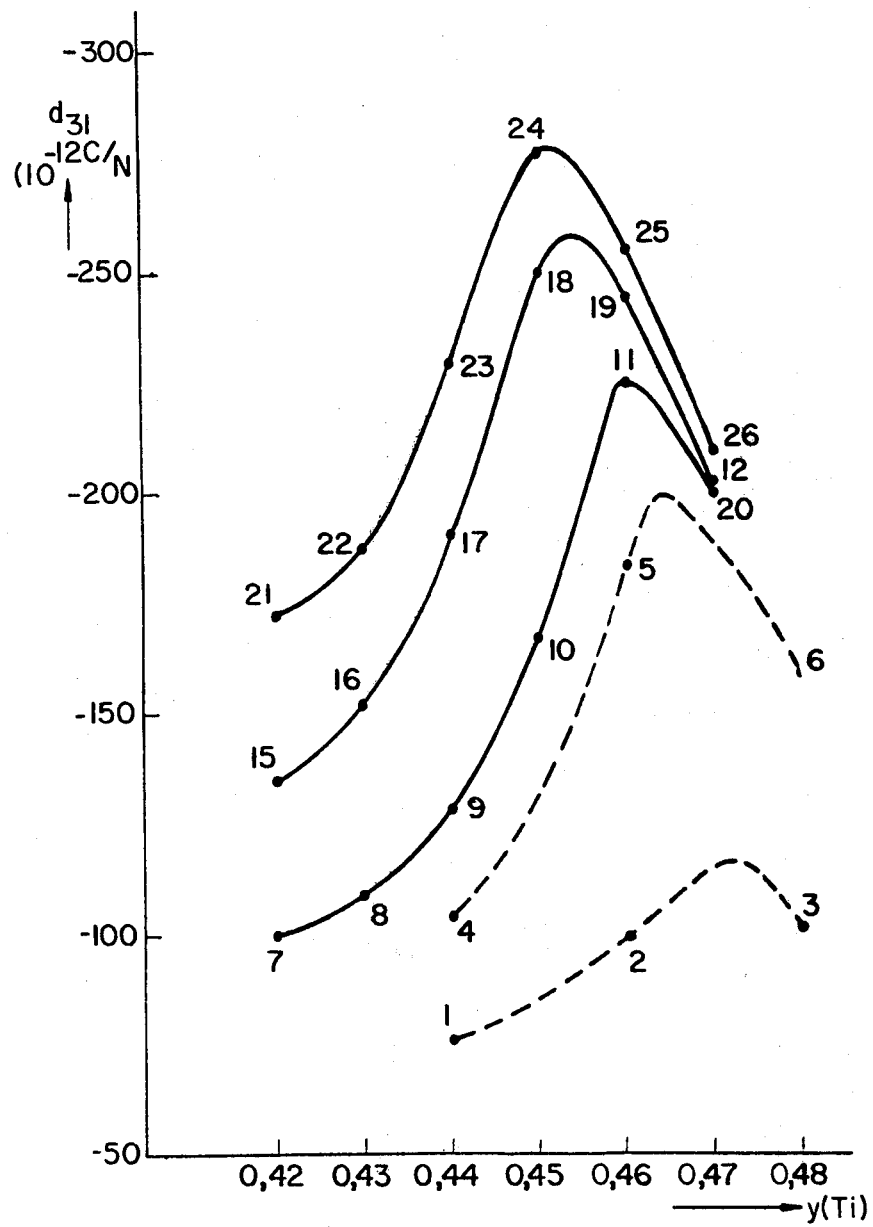
FIG. 3 is a graph showing the change constant as a function of the Ti content.

The relationship of the above-mentioned properties to the Ti-content is also shown in the graphs of FIGS. 1, 2 and 3, the numbers of the points in the graphs corresponding to the respective numbered compositions listed in Table I.

TABLE II

| | time stability (% per decade) polarizing temperature | | temperature stability (% per decade) polarizing temperature | |
|---|---|---|---|---|
| | 25° C. | 150° C. | 25° C. | 150° C. |
| $\epsilon_{33}^T/\epsilon_0$ | −1.8 | −0.6 | +16 | +14 |
| $K_p$ | −0.7 | −0.4 | −2.3 | −3.4 |
| $N_p$ | +0.15 | +0.1 | +0.15 | 0 |
| $d_{31}$ | −2.5 | −0.8 | +4.7 | +3.7 |

Figure 4A:
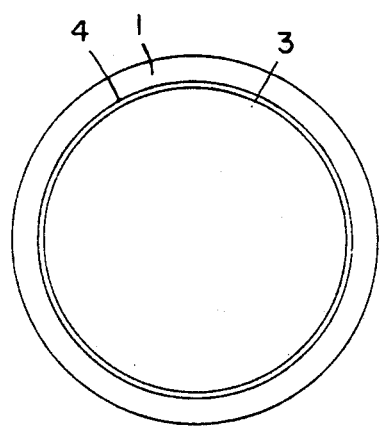
FIG. 4a is a plan view and FIG. 4b is a cross-sectional side view of a buzzer element employing the piezoelectric body of the invention.
Figure 4B:
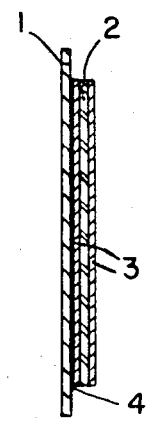

An example of an electromechanical transducer employing a piezoelectric body of the invention is a buzzer element, a top view of which is shown in FIG. 4a and a cross-sectional side view of which is shown in FIG. 4b.

Referring to FIG. 4B, such a buzzer element comprises a $20^2$ mm $\times$ 0.2 mm brass membrane 1 joined to a $16^2$ mm $\times$ 0.2 mm ceramic disk 2 having the composition 18 of Table I, and provided with silver electrodes 3, having a thickness of a few mm, deposited on a surface of the ceramic disk 2 by evaporation.

The brass membrane and the ceramic disk 2 are joined to each other by means of a thin layer 4 of a commerically available epoxy adhesive which adhesive layer is hardened by heating the resulting assembly for 1 hour at 180° C. or for 10 minutes at 200° C.

TABLE I

General formula $Pb_{1-a}Sr_a\{(Mg_{1-b}Mn_b)_{\frac{1}{3}}Sb_{\frac{2}{3}}\}_x Ti_y Zr_z O_3$

| | Molar ratio of basic composition | | | substituents | | | 24 hours after polarizing | | | | |
|---|---|---|---|---|---|---|---|---|---|---|---|
| Ex. no. | (PbMg$_{\frac{1}{3}}$Sb$_{\frac{2}{3}}$O$_3$) x | (PbTiO$_3$) y | (PbZrO$_3$) z | (Sr) a | (Mn) b | $\rho_s$ (g/cm$^3$) | $\epsilon_{33}^T/\epsilon_0$ at 1kHz | tan $\delta$ at 1kHz ($\times 10^{-4}$) | $k_p$ | $N_p$ (Hz·m) | $d_{31}$ ($10^{-12}$C/N) |
| 1 | 0.05 | 0.44 | 0.51 | 0 | 0 | 7.77 | 625 | 165 | 0.491 | 2210 | −76 |
| 2 | 0.05 | 0.46 | 0.49 | 0 | 0 | 7.77 | 880 | 138 | 0.533 | 2180 | −99 |
| 3 | 0.05 | 0.48 | 0.47 | 0 | 0 | 7.77 | 1250 | 104 | 0.473 | 2210 | −103 |
| 4 | 0.125 | 0.44 | 0.435 | 0 | 0 | 8.06 | 950 | 166 | 0.573 | 2260 | −104 |
| 5 | 0.125 | 0.46 | 0.415 | 0 | 0 | 8.06 | 1950 | 141 | 0.658 | 2060 | −189 |
| 6 | 0.125 | 0.48 | 0.395 | 0 | 0 | 8.06 | 2150 | 109 | 0.570 | 2230 | −158 |
| 7 | 0.125 | 0.42 | 0.455 | 0.02 | 0 | 8.00 | 1085 | 201 | 0.526 | 2335 | −100 |
| 8 | 0.125 | 0.43 | 0.445 | 0.02 | 0 | 8.00 | 1185 | 196 | 0.544 | 2295 | −109 |
| 9 | 0.125 | 0.44 | 0.435 | 0.02 | 0 | 8.00 | 1310 | 180 | 0.589 | 2230 | −128 |
| 10 | 0.125 | 0.45 | 0.425 | 0.02 | 0 | 8.00 | 1795 | 171 | 0.628 | 2125 | −168 |
| 11 | 0.125 | 0.46 | 0.415 | 0.02 | 0 | 8.01 | 2620 | 165 | 0.663 | 2026 | −225 |
| 12 | 0.125 | 0.47 | 0.405 | 0.02 | 0 | 8.00 | 2675 | 141 | 0.613 | 2115 | −201 |
| 13 | 0.125 | 0.40 | 0.475 | 0.05 | 0 | 7.92 | 1535 | 219 | 0.514 | 2340 | −116 |
| 14 | 0.125 | 0.41 | 0.465 | 0.05 | 0 | 7.91 | 1590 | 211 | 0.525 | 2305 | −123 |
| 15 | 0.125 | 0.42 | 0.455 | 0.05 | 0 | 7.90 | 1780 | 230 | 0.533 | 2255 | −135 |
| 16 | 0.125 | 0.43 | 0.445 | 0.05 | 0 | 7.91 | 1865 | 200 | 0.573 | 2210 | −151 |
| 17 | 0.125 | 0.44 | 0.435 | 0.05 | 0 | 7.91 | 2285 | 200 | 0.629 | 2115 | −192 |
| 18 | 0.125 | 0.45 | 0.425 | 0.05 | 0 | 7.91 | 3245 | 210 | 0.657 | 2030 | −249 |
| 19 | 0.125 | 0.46 | 0.415 | 0.05 | 0 | 7.90 | 3625 | 180 | 0.629 | 2085 | −245 |
| 20 | 0.125 | 0.47 | 0.405 | 0.05 | 0 | 7.89 | 3080 | 147 | 0.583 | 2195 | −199 |
| 21 | 0.15 | 0.42 | 0.43 | 0.05 | 0 | 7.95 | 2835 | 257 | 0.537 | 2220 | −173 |
| 22 | 0.15 | 0.43 | 0.42 | 0.05 | 0 | 7.96 | 2910 | 258 | 0.564 | 2175 | −188 |
| 23 | 0.15 | 0.44 | 0.41 | 0.05 | 0 | 7.95 | 3555 | 290 | 0.610 | 2115 | −231 |
| 24 | 0.15 | 0.45 | 0.40 | 0.05 | 0 | 7.96 | 4345 | 293 | 0.646 | 2060 | −278 |
| 25 | 0.15 | 0.46 | 0.39 | 0.05 | 0 | 7.96 | 4305 | 233 | 0.609 | 2110 | −255 |
| 26 | 0.15 | 0.47 | 0.38 | 0.05 | 0 | 7.96 | 3650 | 180 | 0.567 | 2200 | −209 |
| 27 | 0.175 | 0.42 | 0.405 | 0.05 | 0 | 7.98 | 5730 | 545 | 0.358 | 2385 | −153 |
| 28 | 0.175 | 0.43 | 0.395 | 0.05 | 0 | 7.98 | 5715 | 530 | 0.428 | 2325 | −187 |
| 29 | 0.175 | 0.44 | 0.385 | 0.05 | 0 | 7.96 | 5325 | 355 | 0.555 | 2200 | −248 |
| 30 | 0.175 | 0.46 | 0.365 | 0.05 | 0 | 7.98 | 5030 | 420 | 0.427 | 2294 | −177 |
| 31 | 0.20 | 0.42 | 0.38 | 0.05 | 0 | 7.96 | 5855 | 570 | 0.235 | 2495 | −97 |
| 32 | 0.20 | 0.43 | 0.37 | 0.05 | 0 | 7.96 | 5910 | 570 | 0.280 | 2450 | −118 |
| 33 | 0.20 | 0.44 | 0.36 | 0.05 | 0 | 7.97 | 5950 | 580 | 0.363 | 2380 | −158 |
| 34 | 0.20 | 0.45 | 0.35 | 0.05 | 0 | 7.98 | 5920 | 460 | 0.450 | 2300 | −202 |
| 35 | 0.20 | 0.46 | 0.34 | 0.05 | 0 | 7.98 | 5500 | 330 | 0.494 | 2265 | −217 |
| 36 | 0.20 | 0.47 | 0.33 | 0.05 | 0 | 7.98 | 4655 | 230 | 0.499 | 2280 | −201 |
| 37 | 0.125 | 0.45 | 0.425 | 0.05 | 0 | 7.93 | 3230 | 197 | 0.668 | 1995 | −256 |
| 38 | 0.125 | 0.45 | 0.425 | 0.05 | 0.05 | 7.93 | 3130 | 130 | 0.659 | 2020 | −246 |
| 39 | 0.125 | 0.45 | 0.425 | 0.05 | 0.10 | 7.95 | 2850 | 68 | 0.656 | 2060 | −229 |
| 40 | 0.125 | 0.45 | 0.425 | 0.05 | 0.20 | 7.93 | 2210 | 29 | 0.638 | 2150 | −188 |

The resultant composite assembly is polarized in an electrical field of 2-3 KV/mm for 1 second in air at ambient temperatures.

What is claimed is:

1. An electromechanical transducer comprising a piezoelectric body corresponding to the ternary system lead titanate-lead zirconate—$Pb(M^{II}_{1/3}M^{V}_{2/3})O_3$, and electrodes attached to said body, characterized in that said piezoelectric body consists of $Pb_{1-a}M_a(Mg_{(1-b)/3}Mn_{b/3}Sb_{2/3})_xTi_yZr_zO_3$, wherein M is one or more of the alkaline earth metals Ca, Sr and Ba, and wherein $0 \leq a \leq 0.15$,
$0 \leq b \leq 0.20$,
$0.01 \leq x \leq 0.25$,
$0.40 \leq y \leq 0.55$,
$0.20 \leq z \leq 0.59$ and
$(x+y+z)=1$.

2. The electromechanical transducer of claim 1, characterized in that in the piezoelectric body $0.125 \leq x \leq 0.15$, $0.44 \leq y \leq 0.46$ and $0.38 \leq z \leq 0.44$, while the molar fraction of Sr is 0.05.

* * * * *